(12) United States Patent
Epp et al.

(10) Patent No.: US 9,185,797 B2
(45) Date of Patent: Nov. 10, 2015

(54) FOIL ELEMENT

(75) Inventors: Sascha Mario Epp, Steinhausen (CH);
John Anthony Peters, Au-Zurich (CH);
Ulrich Schindler, Furth/Bayern (DE)

(73) Assignee: OVD KINEGRAM AG, Zug (CH)

( * ) Notice: Subject to any disclaimer, the term of this patent is extended or adjusted under 35 U.S.C. 154(b) by 393 days.

(21) Appl. No.: 13/814,886

(22) PCT Filed: Jul. 28, 2011

(86) PCT No.: PCT/EP2011/003778
§ 371 (c)(1),
(2), (4) Date: Apr. 4, 2013

(87) PCT Pub. No.: WO2012/019713
PCT Pub. Date: Feb. 16, 2012

(65) Prior Publication Data
US 2013/0207848 A1    Aug. 15, 2013

(30) Foreign Application Priority Data

Aug. 11, 2010  (DE) .......................... 10 2010 034 156

(51) Int. Cl.
*H01Q 1/38* (2006.01)
*H05K 1/02* (2006.01)
*B32B 15/04* (2006.01)
*B32B 15/20* (2006.01)
(Continued)

(52) U.S. Cl.
CPC .............. *H05K 1/0271* (2013.01); *B32B 15/04* (2013.01); *B32B 15/20* (2013.01); *B32B 27/302* (2013.01); *B32B 27/304* (2013.01); *B32B 27/32* (2013.01); *B32B 27/36* (2013.01); *G06K 19/07749* (2013.01); *G06K 19/07773* (2013.01); *H01Q 1/2225* (2013.01); *H01Q 1/38* (2013.01); *H01Q 1/40* (2013.01); *H01Q 7/00* (2013.01); *H05K 1/165* (2013.01); *B32B 2307/204* (2013.01); *H05K 3/4626* (2013.01); *H05K 2201/09263* (2013.01)

(58) Field of Classification Search
USPC ..................... 343/700 MS, 741, 866; 174/250
See application file for complete search history.

(56) References Cited

U.S. PATENT DOCUMENTS 4,475,107 A    10/1984  Makimoto et al.
5,574,470 A *  11/1996  de Vall .......................... 343/895
(Continued)

FOREIGN PATENT DOCUMENTS

DE    4410732      10/1995
DE    10117994     10/2002
(Continued)

*Primary Examiner* — Dieu H Duong
(74) *Attorney, Agent, or Firm* — Hoffmann & Baron, LLP

(57) ABSTRACT

A foil element and a method for producing such a foil element. The foil element includes a dielectric carrier layer, which spans an xy plane of a Cartesian coordinate system having an x-axis, a y-axis and a z-axis, and at least one electrically conductive layer which is arranged on the carrier layer and in which a conductor track is shaped in a frame-shaped region of the foil element. The frame-shaped region is formed by the area of a larger, outer rectangle having sides each running parallel to the x-axis or y-axis, from which area the area of a smaller, inner rectangle with the same orientation as the outer rectangle is cut out. A mechanical property of the carrier layer is different along the x-axis and the y-axis. More than 50% of the length of at least one conductor track section runs obliquely with respect to the x-axis and the y-axis.

16 Claims, 10 Drawing Sheets

(51) Int. Cl.
  *B32B 27/30* (2006.01)
  *B32B 27/32* (2006.01)
  *B32B 27/36* (2006.01)
  *G06K 19/077* (2006.01)
  *H01Q 1/22* (2006.01)
  *H01Q 1/40* (2006.01)
  *H01Q 7/00* (2006.01)
  *H05K 1/16* (2006.01)
  *H05K 3/46* (2006.01)

(56) References Cited

U.S. PATENT DOCUMENTS

| | | | |
|---|---|---|---|
| 6,088,230 | A | 7/2000 | Finn et al. |
| 8,077,114 | B2 | 12/2011 | Lehnberger |
| 2001/0002035 | A1* | 5/2001 | Kayanakis .................. 235/492 |
| 2004/0173377 | A1 | 9/2004 | Senge |
| 2005/0134506 | A1 | 6/2005 | Egbert |
| 2008/0142150 | A1 | 6/2008 | Robert |
| 2009/0280342 | A1 | 11/2009 | Minnetian |
| 2009/0322634 | A1* | 12/2009 | Yun et al. .................. 343/741 |
| 2015/0008262 | A1 | 1/2015 | Peters et al. |

FOREIGN PATENT DOCUMENTS

| | | |
|---|---|---|
| DE | 10150194 | 4/2003 |
| DE | 10248393 | 5/2004 |
| DE | 102006029397 | 1/2008 |
| DE | 102007030414 | 5/2009 |
| EP | 1372213 | 12/2003 |
| EP | 1120855 | 12/2007 |
| EP | 1580041 | 5/2009 |
| FR | 2883222 | 9/2006 |
| JP | 2000-090221 | 3/2000 |
| JP | 2003-332820 | 11/2003 |
| WO | WO 03/050913 | 6/2003 |
| WO | WO 2008/050157 | 5/2008 |
| WO | WO 2009146272 | 12/2009 |
| WO | WO 2010/076335 | 7/2010 |

* cited by examiner

FOIL ELEMENT

This application claims priority based on an International Application filed under the Patent Cooperation Treaty, PCT/EP2011/003778, filed on Jul. 28, 2011, and German Application No. DE 102010034156.8, filed on Aug. 11, 2010.

BACKGROUND OF THE INVENTION

The invention relates to a foil element comprising a dielectric carrier layer and at least one electrically conductive layer arranged on the carrier layer, and to a method for producing such a foil element.

DE-B-102007030414 describes a method for producing an electrically conductive structure on a dielectric carrier substrate, such as a PET foil (PET=polyethylene terephthalate). In this case, firstly a conductive layer, a so-called seed layer, in the form of a conductor track, for example an RFID antenna, is formed by patterned printing of a conductive printing substance, for example metal particles bound in a dispersant, on the surface of the carrier substrate (RFID=Radio Frequency Identification). The printed seed layer is subsequently reinforced by plating in order to form the electrically conductive structure by means of a metallic coating being deposited on the conducive layer by the application of a current flow in an electrolyte containing a dissolved coating metal.

It is known that foil elements which are subjected to elevated temperatures, for example during a lamination process, can become wavy, which can result in considerable disadvantages. Thus, DE-A-102006029397 describes a plastic carrier foil with a security element arranged thereon, wherein the carrier foil, after a further plastic foil has been laminated over the carrier foil and after cooling of the layer composite, in the region of the security element, exhibits an orange peel effect in such a way that the security element appears wavy over its whole area. This problem is solved by heat treatment of the carrier foil before the security element is applied, since this evidently brings about a local reduction of the internal stress in the carrier foil.

SUMMARY OF THE INVENTION

The invention is based on the object, then, of specifying an improved foil element and a method for producing such a foil element.

The object is achieved by means of a foil element, comprising a dielectric carrier layer, which spans an xy plane of a Cartesian coordinate system having an x-axis, a y-axis and a z-axis, and at least one electrically conductive layer which is arranged on the carrier layer and in which a conductor track is shaped in a frame-shaped region of the foil element, said region being formed by the area of a larger, outer rectangle having sides each running parallel to the x-axis or y-axis, from which area the area of a smaller, inner rectangle with the same orientation as the outer rectangle is cut out, wherein the frame-shaped region is subdivided into two frame sections running parallel to the x-axis and two frame sections running parallel to the y-axis, which frame sections are in each case bounded by a bounding side of the outer rectangle and a side of the inner rectangle directly adjacent to the bounding side of the outer rectangle and parallel thereto and subdivide the conductor track into conductor track sections, wherein a mechanical property of the carrier layer is different along the x-axis and the y-axis, and wherein more than 50% of the length of at least one conductor track section, as viewed parallel to the z-axis, runs obliquely with respect to the x-axis and the y-axis. This object is furthermore achieved by a method for producing a foil element, comprising the following steps: providing a dielectric carrier layer, which spans an xy plane of a Cartesian coordinate system having an x-axis, a y-axis and a z-axis, wherein a mechanical property of the carrier layer is different along the x-axis and the y-axis; applying at least one electrically conductive layer to a surface of the carrier layer; and shaping a conductor track in the at least one electrically conductive layer in a frame-shaped region of the foil element, said region being formed by the area of a larger, outer rectangle having sides each running parallel to the x-axis or y-axis, from which area the area of a smaller, inner rectangle with the same orientation as the outer rectangle is cut out, wherein the frame-shaped region is subdivided into two frame sections running parallel to the x-axis and two frame sections running parallel to the y-axis, which frame sections are in each case bounded by a bounding side of the outer rectangle and a side of the inner rectangle directly adjacent to the bounding side of the outer rectangle and parallel thereto and subdivide the conductor track into conductor track sections, in such a way that more than 50% of the length of at least one conductor track section, as viewed parallel to the z-axis, runs obliquely with respect to the x-axis and the y-axis.

A conductor track section runs in a single frame section. Therefore, there is an assignment of a conductor track section to a specific frame section. One or a plurality of conductor track sections can be assigned to a specific frame section.

One aspect of the invention is based on the known fact that an industrially produced carrier layer in the form of a plastic foil generally has two distinguished directions in a plane spanned by the carrier layer, the so-called main relaxation directions, in which the carrier layer has very different mechanical properties. One of these two distinguished directions in the case of plastic foils may be the running direction, which corresponds to a production direction in which the foil is moved during its production. The other distinguished direction in the case of plastic foils preferably runs transversely with respect to the running direction. Usually, in the case of plastic foils, the running direction is designated as the longitudinal direction or machine direction (for short: MD) and the direction preferably running perpendicular thereto is designated as the transverse direction (for short: TD). There is a comparable situation in the case of papers manufactured by machine: the running direction is a customary indication in the case of papers which relates to the orientation of the paper fibers parallel to the running direction of the paper machine.

This anisotropy of the plastic foil is known, e.g. from biaxially oriented polypropylene foils, for short BOPP foils. Numerous properties of polypropylene foils, such as mechanism, optics and barrier effect, can be improved by stretching the foil. Stretching leads to a detectable directional molecular orientation and thus to the anisotropic character of the foil.

In conventional foil elements comprising a dielectric carrier layer and at least one electrically conductive layer which is arranged thereon and in which a conductor track is shaped in a frame-shaped region of the foil element, the conductor track, which forms a copper antenna coil, for example, follows the main relaxation directions over the largest part of its length. During the production of lamination products or lamination intermediate products such as a "prelaminated inlay" (for short: "Prelam") or an "electronic passport cover" (cover for an ID document having an RFID inlay) using these conventional foil elements, a waviness can be reproduced on the product, such that the product can no longer be used further (ID=Identification).

Said waviness may already be discernible on the conventional foil element, but is generally not yet disturbing. It is only after the conventional foil element has been subjected to elevated temperatures, e.g. during a lamination at temperatures of approximately 100° C., that said waviness may be so pronounced that it can no longer be afforded tolerance. In this case, the waviness can extend through to outer layers of a laminate and appear there as disturbing waves perceptible optically and/or in a tactile manner.

The extent to which said waviness appears is dependent on the thickness of the carrier layer, on the thickness of the conductive layer and on the exact course of the conductor track on the carrier layer. Given sufficiently thick carrier foils having a thickness of more than 300 μm, preferably more than 500 μm, no waves, or only weakly pronounced waves which can be afforded tolerance, arise on account of the stability of the foils. However, if the layer thickness of the carrier layer is in a range of less than 300 μm, the waviness appears to a disturbing extent. Depending on the thickness of the carrier layer, the waviness is also influenced by the thickness of the conductive layer applied on the carrier layer. If the thickness of the conductive layer is relatively large in comparison with the carrier layer, then the resulting waviness is comparatively great, that is to say that the waviness appears to a high extent. If the thickness of the conductive layer is relatively small in comparison with the carrier layer, than the resulting waviness is comparatively small, that is to say that the waviness appears to a small extent. This is owing to the fact that a conductive layer which is thick relative to the carrier layer has a high mechanical stability and thus produces undesirable mechanical stresses between carrier layer and conductive layer, which appear as waviness to a disturbing extent during or after the lamination. The thicker and stabler the carrier layer is relative to the conductive layer applied thereon, the smaller can be the waviness which occurs during or after the lamination. By way of example, the waviness of a carrier layer having a thickness of approximately 300 μm to which a conductive layer having a thickness of approximately 10 μm is applied becomes apparent only to a small extent. By way of example, however, the resulting waviness of a carrier foil having a thickness of approximately 50 μm to which a conductive layer having a thickness of approximately 10 μm is applied is noticeable to a greater extent.

One explanation of this phenomenon is that stress states between the carrier layer and the at least one electrically conductive layer arranged thereon, in particular the conductor track or conductor tracks, are virtually "frozen" in the foil element but are released by the elevated temperatures. In this case, a relaxation of the material of the carrier layer occurs, which cannot be followed, however, by the material of an overlying electrically conductive layer, which leads to the observed waviness.

The foil element according to the invention is now distinguished relative to conventional foil elements by the fact that a significant part of at least one conductor track section of the conductor track, preferably more than 50% of its length, does not run in the main relaxation directions of the carrier layer, but rather in directions deviating therefrom, that is to say obliquely with respect to the main relaxation directions. If the foil element according to the invention is exposed to temperatures in a range of approximately 100° C. or higher, for example during a lamination process, for arranging further foil layers on the foil element or when connecting a chip module to the coil formed as an antenna, formation of a waviness in the foil element is avoided by means of the course of the conductor track according to the invention. The foil element according to the invention thus avoids the phenomenon—known from conventional foil elements comprising a dielectric carrier layer and an electrically conductive structure arranged thereon—that the foil element, depending on the thickness of the carrier layer, can become wavy in the course of a thermal treatment during further processing. The parts of the conductor track which run obliquely with respect to the x-axis and y-axis therefore form stress compensating elements which can compensate for stresses present in the foil element.

A further aspect of the invention is based on an increase of the conductor track length which results from the predominantly oblique course of the conductor track with respect to the x-axis and the y-axis. The electrical resistance of the conductor track, which increases with the conductor track length, corresponds, if the conductor track is designed as an antenna, e.g. a transponder antenna for RFID tags, to a decrease in the quality factor Q, also called resonant circuit quality or Q-factor ("Q-value"). While a very high quality factor in the range of Q>30 can be present primarily in the case of a double-sided antenna, for specific applications in which a very high data transfer rate is used, a reduced quality factor is advantageous for communication stability. Therefore, in applications in which a modification, in particular a reduction, of the quality factor is advantageous, the foil element according to the invention offers a higher design freedom for finding an antenna layout optimally adapted to the respective application than a conventional foil element. In this case, it should be evaluated as expedient that an oblique, e.g. curved, conductor track routing according to the invention does not result in a significant change in the inductance of the conductor track.

The foil element according to the invention is suitable in particular for mass-produced products such as RFID tags, credit cards, smart cards, passports and the like which require cost-effective manufacture in conjunction with a small space requirement.

Advantageous configurations of the invention are designated in the dependent claims.

In accordance with one preferred exemplary embodiment of the invention, at least one electrode area which is electrically connected to the conductor track is formed in the at least one electrically conductive layer. The at least one electrode area can serve as a contact point for a chip module and/or as a through-plating point to an electrode area arranged on the opposite surface of the carrier layer.

The layer thickness of the carrier layer is preferably between 12 and 250 μm, with further preference between and 100 μm. In this case, the carrier layer preferably consists of a plastic foil such as a PET, PET-G, PVC, PC, PP, PS, PEN, ABS, or a BOPP foil, of synthetic paper or a laminate composite of two or more such layers (PET-G=PET with glycol; PVC=polyvinyl chloride; PC=polycarbonate; PP=polypropylene; PS=polystyrene; PEN=polyethylene naphthalate; ABS=acrylonitrile-butadiene-styrene copolymer). Furthermore, it is also possible for the carrier layer to be embodied in a multilayered fashion and to consist, for example, of a plastic foil and one or more decorative layers.

Preferably, the foil element according to the invention has a substantially rectangular shape and the y-direction corresponds to the direction of the longer dimension of the carrier layer.

The layer thickness of the electrically conductive layer is preferably between 1 and 30 μm, with further preference between 8 and 20 μm. In this case, the layer thickness of the electrically conductive layer can be constant or non-constant. The at least one electrically conductive layer preferably involves layers consisting of or containing a metallic, electrically conductive material, for example aluminum, copper, silver, chromium, gold or a metal alloy. Furthermore, it is also possible for the at least one electrically conductive layer to consist of or contain some other electrically conductive material, for example an electrically conductive polymer, graphene or a transparent, electrically conductive material, for example ITO (=indium tin oxide).

In accordance with one preferred exemplary embodiment of the invention, the point of intersection of diagonals of the inner rectangle coincides with that of the outer rectangle, such that the respectively opposite frame sections have the same width. In this case, it is also possible for all frame sections of the frame to have the same width. The frame-shaped region forms a circumferentially extending, self-contained corridor which preferably extends circumferentially around the point of intersection of diagonals of a product formed from the foil element and having rectangular shaping, e.g. a smart card.

It is advantageous if at least 80%, preferably at least 90%, of the length of the at least one conductor track section runs obliquely with respect to the x-axis and the y-axis. The undesirable waviness of the foil element correlates negatively with the portion of the conductor track in which the conductor track does not run along the main relaxation directions; in other words, the greater the ratio of the sum of the partial segments in which the conductor track runs obliquely with respect to the x-axis and the y-axis to the total length of the conductor track, the smaller the waviness that forms on the foil element.

It is possible for the at least one conductor track section to run in a wavy or zigzag fashion, e.g. in a triangular or sawtooth-shaped fashion, in its obliquely running portion. A wavy or a zigzag conductor track has only insignificantly small or no track portions in which the conductor track runs along the main relaxation directions. Therefore, a conductor track running in a wavy fashion or a conductor track running in a zigzag fashion is advantageous in order to avoid an undesirable waviness of the foil element. It is possible for the at least one conductor track section to form a track pattern composed of a multiplicity of individual elements that are of the same type and are connected to one another.

It is advantageous if the y-direction specifies the machine direction of the carrier layer and the x-axis specifies the transverse direction of the carrier layer running transversely with respect thereto. These two directions distinguished in the carrier layer are characterized by a preferred molecular orientation in the material of the carrier layer, which can be determined e.g. spectroscopically or by measurement of optical properties such as birefringence or dichroism. Along the machine direction and the transverse direction of the carrier layer running transversely with respect thereto, mechanical properties such as the modulus of elasticity, for short: E modulus, the tensile strength, the elongation at break, the elongation at break or the impact strength, but also the thermal instability or the shrinkage have measured values that deviate significantly from one another on average.

It is possible for the mechanical property to be a deformation behavior such as a compressive or tensile strength, an inherent stress in the material of the carrier layer or a relaxation behavior, e.g. a stress relaxation, in particular a relaxation of the material of the carrier layer that occurs in the course of a thermal treatment at elevated temperatures, e.g. during a lamination process at temperatures of approximately 100° C.

It is preferred for the conductor strip to form a coil, in particular a coil serving as an electromagnetic coupling element, e.g. an antenna, wherein at least one turn of the coil extends circumferentially around the inner rectangle. The coil preferably has 1 to 10, with further preference 1 to 4, turns. In this case, a turn of the coil is in each case subdivided into four conductor track sections extending over respectively one of the frame sections.

In accordance with one preferred exemplary embodiment of the invention, the length of a first side of the inner rectangle is at least 50%, preferably at least 60%, of the length of a side of the outer rectangle parallel thereto and the length of a side of the inner rectangle running perpendicular to the first side of the inner rectangle is at least 70%, preferably at least 75%, of the length of a side of the outer rectangle parallel thereto. In this case, the frame-shaped region forms a narrow circumferentially extending area strip in which the conductor track is arranged.

It is preferred if the length of a first side of the inner rectangle is in the range of 30 to 40 mm and the length of a side of the outer rectangle parallel thereto is in the range of 45 to 55 mm. It is further preferred if the length of a side of the inner rectangle running perpendicular to the first side of the inner rectangle is in the range of 60 to 70 mm and the length of a side of the outer rectangle parallel thereto is in the range of 75 to 85 mm. It is further preferred if the circumferentially extending area strip formed by the frame-shaped region has a width in the range of 5 to 10 mm.

It is furthermore possible for the foil element to comprise a first electrically conductive layer, in which a first conductor track is shaped in the frame-shaped region of the foil element, and a second electrically conductive layer, in which a second conductor track is shaped in the frame-shaped region. In this case, the carrier layer is arranged between the first and second electrically conductive layers. Moreover, in this case, the first and second conductor tracks are coupled to one another to form an antenna structure, preferably by a plated-through hole penetrating through the carrier layer. And at least one conductor track section of the first and second conductor tracks in this case has the above-mentioned oblique profile. The coupled first and second conductor tracks preferably form a coil, in particular a coil serving as an antenna, e.g. an antenna of an RFID transponder.

In accordance with one preferred exemplary embodiment of the invention, a first and a second electrode area, which are respectively electrically connected to the first and/or second conductor track, are formed in the first and/or the second electrically conductive layer. Preferably, the first and second conductor tracks are in this case connected to one another and/or capacitively or inductively coupled to one another via at least one electrically conductive plated-through hole through the carrier layer.

By means of a variation of the mutual overlap, e.g. by means of an offset of the first conductor track relative to the second conductor track or a change in the width of one or both conductor tracks, electrical properties such as the electrical capacitance C or the resonant frequency f of the antenna can be varied and adapted to a specific application. It is possible for the first and second conductor tracks to overlap completely, corresponding to a so-called "Full Width Overlap" (=FWO). It is also possible for the first and second conductor tracks to overlap only in regions, corresponding to a so-called "partial width overlap" (=PWO). By way of example, a first, coil-shaped conductor track can comprise two turns and a second, coil-shaped conductor track can comprise one turn, wherein the turn of the second conductor track, as viewed parallel to the z-axis runs between the two turns of the first conductor track and overlaps the latter from both sides.

The preferably first conductor track preferably has a conductor track width of 0.5 to 5 mm, with further preference of 1 to 2 mm. It is possible for the width of the first conductor track to be greater than or equal to or less than the width of the second conductor track. By way of example, a reduction of the area of overlap between the first and second conductor tracks can be obtained by reducing the conductor track width of the second conductor track. In this way, electrical properties such as the capacitance C or the resonant frequency f of the antenna can be varied and adapted to a specific application.

It is possible for the course of the at least one conductor track section to be described by {x;y} coordinate pairs defined by a preferably periodic structuring function F(x or respectively y). Said {x;y} coordinate pairs relate to the Cartesian coordinate system in whose xy plane the carrier layer extends. In the frame sections extending parallel to the x-axis, the course of the at least one conductor track section is described by {x;y} coordinate pairs defined by a structuring function y=F(x). In the frame sections extending parallel to the y-axis, the course of the at least one conductor track section is described by {x;y} coordinate pairs defined by a structuring function x=F(y).

In the case of a periodic structuring function F(x or respectively y), the period of the structuring function is chosen to be preferably less than double the length of the respective frame section, in particular less than the single length of the frame section. As a result, a frame section has half a period of the structuring function, in particular a complete period of the structuring function. The frame sections preferably have lengths of between 20 mm and 120 mm, particularly preferably between 35 mm and 80 mm.

It is preferred for the period of a periodic structuring function to be chosen to be all the smaller, the higher the anisotropy of the mechanical properties of the carrier layer. In this way, the at least one periodically structured conductor track section comprises all the more periods, the higher the anisotropy of the mechanical properties of the carrier layer.

It is preferred if the structuring function F(x or respectively y) is designed such that the ratio of a sum of the partial lengths of the at least one conductor track section in which the conductor track section runs obliquely with respect to the x-axis and the y-axis to a total length of the at least one conductor track section is maximal.

It is preferred if the structuring function F(x or respectively y) is a sine function of the form $y=F(x)=A*\sin(2*\pi*f*x+\phi)$ or $x=F(y)=A*\sin(2*\pi*f*y+\phi)$, wherein A is an amplitude, f is a frequency and $\phi$ is a phase angle. A conductor track section embodied as a sine curve runs parallel to the x-axis or y-axis only at the maxima and minima of the sine curve, that is to say only at two individual points per period. In this configuration, the portion of the at least one conductor track section in which the conductor track section runs along the main relaxation directions is therefore so small that the waviness of the carrier layer is practically minimal. Therefore, a sine curve forms a preferred course of the conductor track.

It is possible for at least two conductor track sections have the abovementioned oblique course, wherein at least one parameter defining the structuring function F(x or respectively y) in the at least two conductor track sections has different values in each case. Parameters which define the substructuring function can be: amplitude, frequency, phase and shape of the structuring function F. In the case of two conductor track sections which run in the same frame section and in which the conductor track in each case runs predominantly obliquely with respect to the x-axis and the y-axis, the frequencies or the amplitudes of the structuring functions F(x or respectively y) assigned to the respective conductor track section have to be coordinated with one another if the distance between the two conductor track sections falls below a specific threshold value. This is because otherwise a contact that forms a short circuit can occur between the conductor track sections. Therefore, provision can be made for the frequency or the shape of the structuring function F(x or respectively y) to change continuously, such that the conductor track sections preferably running in a wavy or zigzag fashion in the same frame section are at a constant distance from one another.

It is possible for all conductor track sections running parallel to the x-axis or all conductor track sections running parallel to the y-axis to run predominantly obliquely with respect to the x-axis and the y-axis. It is also possible for all conductor track sections to exhibit the abovementioned oblique course.

It is possible for two conductor track sections running in two different parallel frame sections to be designed to be symmetrical relative to an axial symmetry axis running parallel to the two parallel frame sections or relative to a point symmetry point. It is also possible for two conductor track sections running in two different, parallel frame sections to be embodied largely identically, in particular for their structuring functions to have the same frequency, the same amplitude and the same phase.

It is possible for the length of the at least one conductor track section to be approximately 0.5 to 30% greater than the length of a corresponding conductor track section that does not run obliquely, in particular of a conductor track section running parallel to the x-axis or y-axis. By virtue of the fact that the conductor track runs predominantly obliquely with respect to the x-axis and the y-axis in the at least one conductor track section, as viewed parallel to the z-axis, e.g. in a wavy shape, the conductor track length is increased relative to a conventionally formed conductor track which runs predominantly parallel to the x-axis or the y-axis in the at least one conductor track section. The electrical resistance R of the conductor track is thus increased. If a respective conductor track, that is to say a first and a second conductor track, is arranged on the two opposite surfaces, that is to say front and rear sides, of the carrier layer, said conductor tracks mutually overlapping one another, the absolute area of overlap of the two conductor tracks is also increased as a result of the oblique course of the conductor tracks. Consequently, the electrical capacitance C of the conductor tracks increases. If the first or second conductor track forms an antenna or if the first and second conductor tracks are coupled to one another to form an antenna, the frequency f of the antenna decreases on account of the oblique course of the conductor track(s).

The electrical properties of the conductor track embodied as an antenna can be influenced by a conductor track structuring according to the invention and a choice of the layer thickness of the conductor track. It is possible that the increase in the conductor track length which results from the predominantly oblique course of the conductor track results in a higher antenna capacitance with the antenna inductance remaining practically the same. It is possible to adapt, in particular to reduce, the capacitance of the antenna by choosing the area of overlap between two conductor tracks arranged preferably on two different surfaces of the carrier layer, in particular by a reduction of the conductor tack width of one of the conductor tracks. Of an increase in the electrical antenna resistance that arises as a result of the increase in the conductor track length which results from the predominately oblique course of the conductor track can be reduced again by means of an increase in the layer thickness of the conductor track, e.g. by the construction of a thicker Cu layer.

By means of the design of the oblique course of the conductor track(s), the present invention therefore affords diverse possibilities for adapting the electrical properties of the conductor track(s), in particular of an antenna formed thereby.

Methods which are synchronized with one another are preferably used for applying and/or structuring a first and second electrically conductive layer onto the carrier layer. It is particularly advantageous in this case if, in a first step, a structured electrically conductive base layer is in each case applied to a first and a second surface of the carrier layer and a plated reinforcement layer is then applied to each of the base layers in a plating bath. In this case, the plating bath can have a plurality of partial baths and can be electroless or else involve current, wherein individual partial baths can be electroless and other partial baths can involve current. In this case, the electrically conductive base layer is preferably structured by means of a printing method. It is thus possible, for example, for a conductive material, for example a conductive ink or paste, to be printed onto the first and second surfaces of the carrier substrate in the regions in which the first conductor track and the second conductor track are respectively intended to be shaped later in the first and second electrically conductive layers. Furthermore, it is also possible for the base layer, in a first step, to be applied to the first and second surfaces of the carrier layer over the whole area, e.g. as a thin metal layer by means of vapor deposition or by means of lamination, and then for an etching resistant to be printed in the regions in which the first or second conductor track is intended to be shaped in the first and second electrically conductive layers. Afterward, the base layer is removed in the regions not covered with the etching resist, by means of an etchant, for example an alkaline solution, and the etching resist is then likewise removed. Furthermore, it is also possible to structure the base layer by printing an etchant onto the whole-area base layer or printing a washing mask prior to applying the whole-area base layer or to print a dielectric barrier layer onto an electrically conductive base layer in the regions in which no electrically conductive regions are intended to be shaped in the first and second conductive layers, said dielectric barrier layer preventing the plated reinforcement layer from being attached by plating in said regions. The structured base layer can also be, for example, directly laminated or hot-embossed or cold-embossed.

In this case, the conductive printing substances, the etching resist layer, the etchant and the dielectric barrier layer are preferably applied by means of two printing units synchronized with one another, wherein one printing unit prints the first surface of the carrier layer and the second printing unit prints the opposite second surface of the carrier layer. In this case, the printing units are preferably arranged in a manner lying opposite one another on different sides of the carrier layer and are coupled to one another via mechanical or electrical means or via register marks on the carrier layer, said register marks being detected by means of sensors on the printing units, in order to operate with register accuracy, i.e. positionally accurately with respect to one another. In this case, the printing methods used are preferably intaglio printing, offset printing, screen printing, pad printing or inkjet printing.

As a result of this procedure, firstly a cost-effective registered, i.e. mutually positionally accurate, structuring of the first and second electrically conductive layers is obtained. Furthermore, it is thereby possible to produce the plated reinforcement layers of the first and second electrically conductive layers simultaneously in a common plating process, as a result of which firstly the production costs and the production time can be reduced, and secondly plated-through holes for connecting the conductive layers through the carrier layer can be concomitantly produced without additional outlay and the process steps necessary therefor can thus be obviated.

The invention is explained below on the basis of a plurality of exemplary embodiments with the aid of the accompanying drawing.

DETAILED DESCRIPTION OF THE INVENTION

Figure 1:
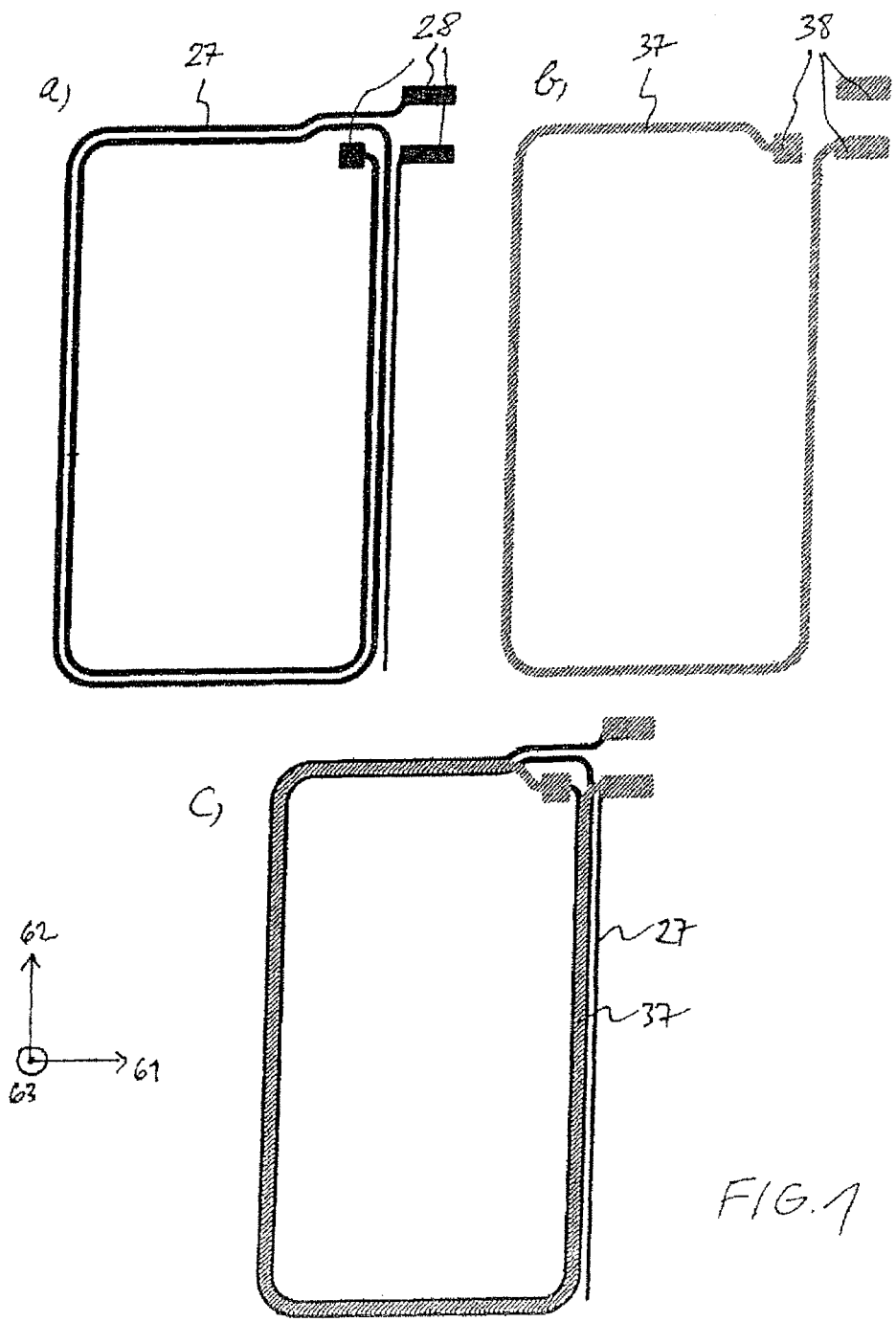
FIG. 1 shows plan views of a first conductor track, of a second conductor track and of a superimposition of the first and second conductor tracks in a conventional foil element.

FIG. 1 shows conductor tracks of a conventional foil element. Part a) illustrates a plan view of a first conductor track 27 of the conventional foil element, part b) illustrates a plan view of a second conductor track 37 of the conventional foil element, and part c) illustrates a plan view of a superimposition of the first and second conductor tracks in accordance with the conventional foil element. The first conductor track 27 is arranged on a first surface of a carrier layer (not illustrated), which extends along an xy plane E of a Cartesian coordinate system having an x-axis 61, a y-axis 62 and a z-axis 63. The second conductor track 37 is arranged on a second surface of the carrier layer opposite the first surface. In this case, the first and second conductor tracks 27, 37 are arranged such that the conductor tracks 27, 37, as shown in part c), overlap, in accordance with a PWO antenna design.

First contact areas 28 electrically connected to the first conductor track 27 are arranged on the first surface of the carrier layer. Second contact areas 38 electrically connected to the second conductor track 37 are arranged on the second surface of the carrier layer. The first and/or second contact areas 28, 38 serve as end faces of plated-through holes through the carrier layer in order provide an electrical connection between the first conductor track 27 and the second conductor track 37, or as contact points for making contact with a chip module in order to provide an electrical connection between the chip module and the first conductor track 27 and/or the second conductor track 37.

Figure 4:
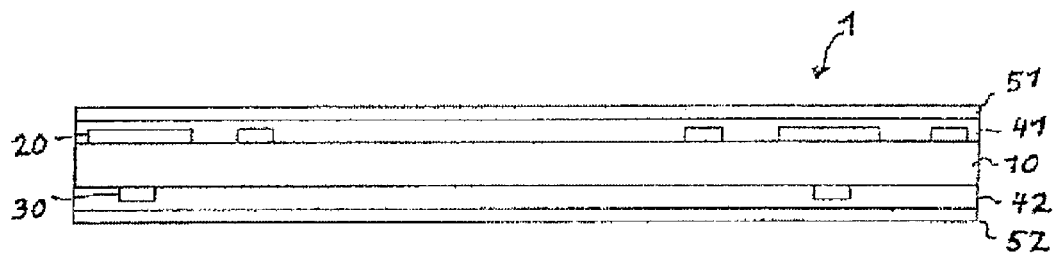

FIG. 4 shows a multilayered foil element 1 comprising a carrier layer 10, a first electrically conductive layer 20 arranged on a first surface of the carrier layer 10, a first decorative layer 41 covering the first electrically conductive layer 20, a first protective layer 43 applied to the first decorative layer 41, a second electrically conductive layer 30 arranged on a second surface of the carrier layer 10, a second decorative layer 42 covering the second electrically conductive layer 30, and a second protective layer 44 applied on the second decorative layer 42.

The carrier layer 10 is formed by a plastic foil, preferably a PET, PET-G, PVC, ABS, polycarbonate or BOPP foil, synthetic paper or a laminate composite of two or more such layers having a thickness of between and 250 µm, preferably between 50 and 100 µm. In this case, the carrier layer 10 preferably consists of a transparent plastic foil.

The protective layers 43 and 44 are protective lacquer layers having a thickness of 1 to 5 µm. However, it is also possible for the protective layers 43 and 44 to be a plastic foil, synthetic paper or a laminate composite of both, having a thickness of between 12 and 100 µm, preferably of approximately 50 µm.

In the simplest case, at least in a partial region, the decorative layers 41 and 42 are color lacquer layers shaped in a patterned fashion. However, it is also possible for the decorative layers 41 and 42 to exhibit one or more optically variable effects which serve as a security feature. Thus, it is possible, for example, for the decorative layers 41 and 42 to consist of a binder with optically active pigments mixed therewith, in particular effect pigments such as metal pigments and/or thin-film layer pigments and/or liquid crystal pigments, or UV- or IR-activatable, luminescent pigments (UV=ultraviolet; IR=infrared). In this case, too, the decorative layers 41 and 42 are preferably configured in a patterned fashion and in this case preferably also exhibit different presentations.

The electrically conductive layers 20 and 30 are preferably layers or layer bundles consisting of or containing a metallic, electrically conductive material, for example aluminum, copper, silver, chromium, gold or a metal alloy. Furthermore, it is also possible for the electrically conductive layers 20 and 30 to consist of or contain some other electrically conducive material, for example an electrically conductive polymer or a transparent, electrically conductive material, for example ITO.

The production of the electrically conductive layers 20 and 30 and the configuration thereof will be explained below with reference to the figures in FIG. 1 to FIG. 4.

Figure 2:
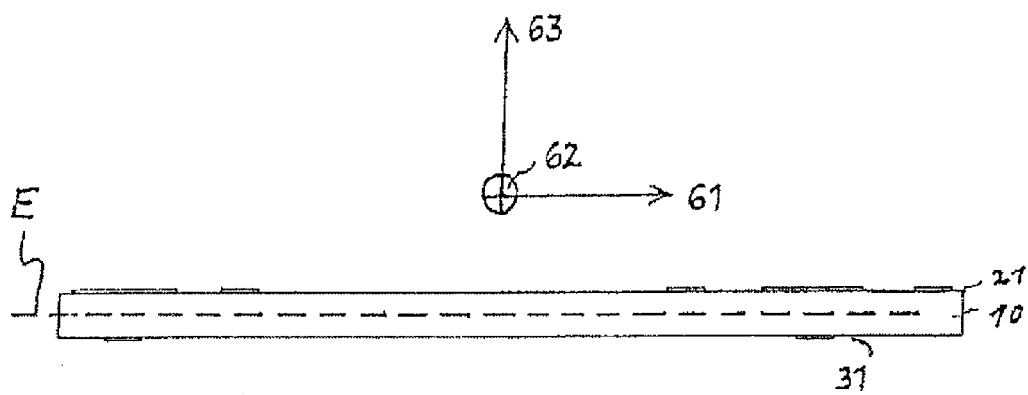
FIGS. 2 to 4 show schematic sectional illustrations, not true to scale, of foil bodies for elucidating the method according to the invention for producing a multilayer foil element.

In order to produce the electrically conductive layers, in a first step, an electrically conductive base layer is applied to the carrier layer 10 extending in the xy plane E. Thus, FIG. 2 shows the carrier layer 10, on one surface of which a base layer 21 is applied and on the opposite other surface of which the base layer 31 is applied.

In this case, the base layers 21 and 31 preferably consist of an electrically conductive printing substance, for example composed of an electrically conductive ink or paste containing metal particles, in particular silver particles or iron particles. In this case, the base layers 21 and 31 are printed onto the carrier layer 10 by means of a printing method, preferably printed by means of an intaglio printing method with an application thickness of between 0.5 and 5 µm, and are then dried. Preferably, the base layers 21 and 31 are in this case printed by means of two synchronized printing units, wherein one printing unit is arranged on one side of the carrier layer 10 and the second printing unit is arranged in a manner lying opposite the first printing unit on the other side of the carrier layer 10. The synchronization of the two printing units is effected by a mechanical coupling of the printing units or by a corresponding electrical coupling, that is to say exchange of corresponding synchronization data. As a result of this procedure, firstly a high register accuracy, that is to say positional accuracy, is obtained when printing the base layers 21 and 31, and secondly a high production speed is obtained. The thickness of the base layers 21 and 31 after drying is preferably 0.3 to 3 µm.

Figure 3:
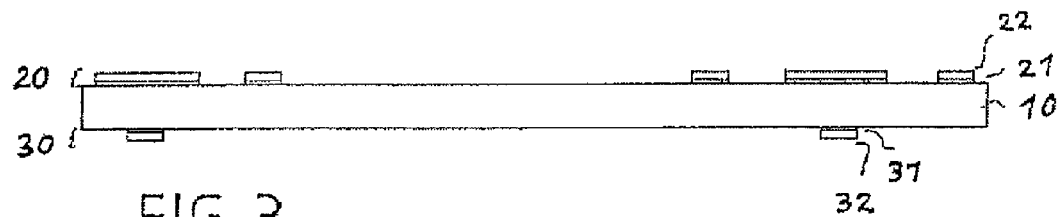

In a second step, the foil body comprising the carrier layer 10 and the base layers 21 and 31 is fed to a plating station, in which, in the region in which the electrically conductive base layers 21 and 31 are provided, a plated reinforcement layer is deposited by means of an electroplating process. For this purpose, electrodes make contact with the electrically conductive base layers 21 and 31 and a voltage potential is applied thereto, such that, from the electrolyte of the plating bath, a plated reinforcement layer 22 and 32 is deposited on the base layers 21 and 31, respectively, as illustrated in FIG. 3. In this case, the deposition of the plated reinforcement layers 32 and 22 is preferably effected in parallel in one and the same plating bath, as a result of which further advantages are achieved, as already explained above.

Preferably, the plated reinforcement layers 22 and 32 in this case consist of a metallic material, which differs from the electrically conductive material of the base layers 21 and 31. The layer thickness of the plated reinforcement layers 22 and 32 is preferably between 0.7 and 25 µm, such that the total thickness of the electrically conductive layers 20 and 30 is between 1 and 30 µm.

After a cleaning process and drying, the decorative layers 41 and 42 and the protective lacquer layers 43 and 44 are then applied and the foil elements are then integrated with another part of a security document or for the time being singulated by means of a cutting or stamping process.

However, it is also possible to dispense with applying one or more of the layers 41, 42, 44 and 44.

In this case, the shaping of the electrically conductive layers 20 and 30 is controlled by the printing process described with reference to FIG. 2. In this case, FIG. 1a clarifies in principle the resultant shaping of the electrically conductive layer 20, and FIG. 1b clarifies the resultant shaping of the electrically conductive layer 30. In contrast to the PWO antenna design in FIG. 1c, the sections in FIGS. 2 to 4 show a mutual arrangement of the conductor tracks 20 and 30 in accordance with an FWO antenna design, wherein the width of the conductor track 30 is less than the width of the conductor track 20.

Figure 5:
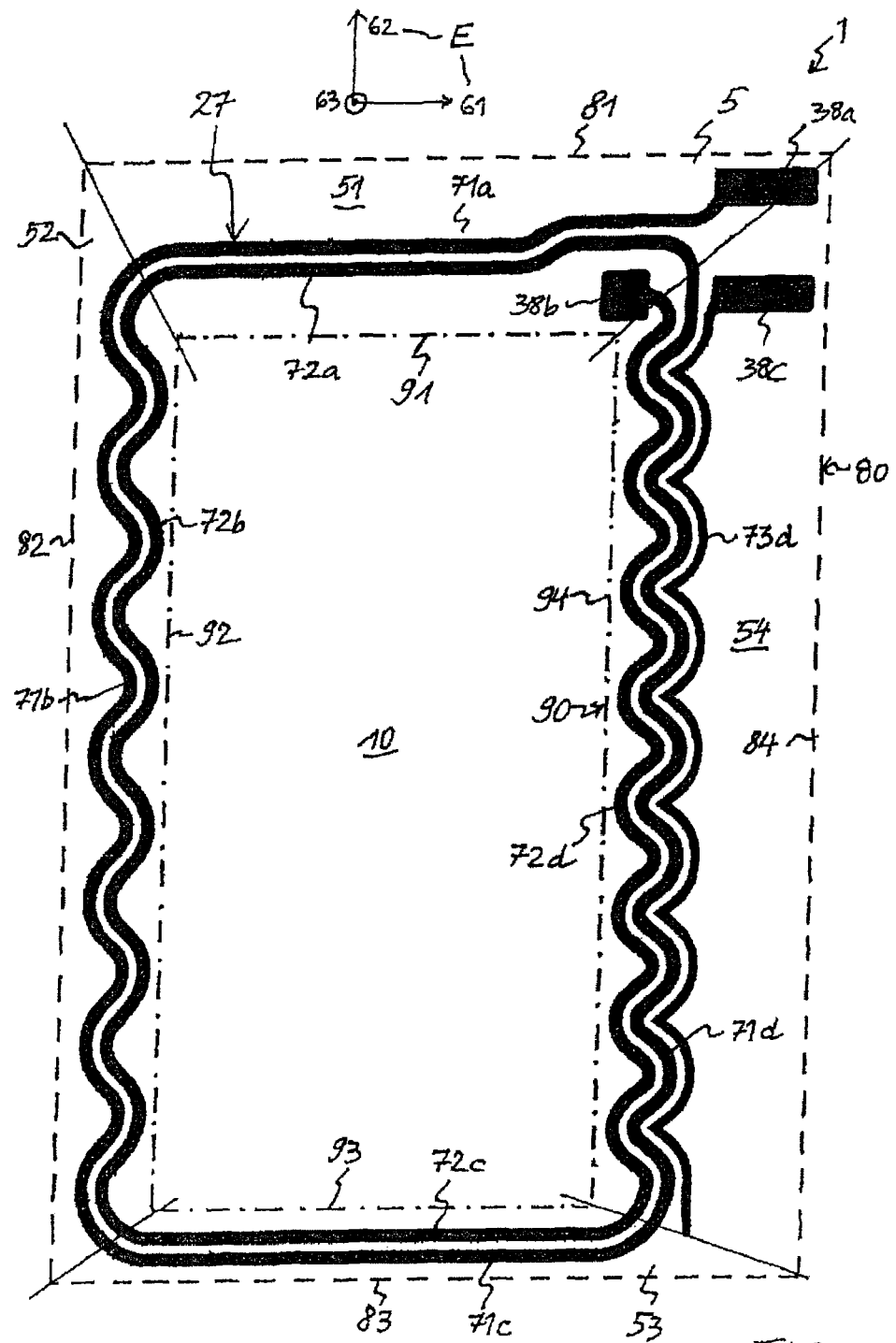
FIG. 5 shows a plan view of a conductor track in accordance with a first exemplary embodiment of the foil element according to the invention.

FIG. 5 shows a plan view of a foil element 1 according to the invention along a z-axis 63 of a Cartesian coordinate system having an x-axis 61, a y-axis 62 and the z-axis 63. The foil element 1 comprise a carrier layer 10, which runs parallel to the xy plane E of the coordinate system. The carrier layer is oriented such that a mechanical property, e.g. the modulus of elasticity, of the carrier layer 10 is different along the x-axis 61 and the y-axis 62.

The foil element 1 additionally comprises a conductor track 27 arranged on a first surface, e.g. a front side, of the carrier layer 10. The conductor track 27 is shaped in a frame-shaped region 5 of the foil element 1, said region being formed by the area of a larger, outer rectangle 80, represented by the dashed boundary line, having two sides 81, 83 running parallel to the x-axis 61 and two sides 82, 84 running parallel to the y-axis 62, from which area the area of a smaller, inner rectangle 90, represented by the dash-dotted boundary line, with the same orientation as the outer rectangle 80 is cut out.

The foil element 1 furthermore comprises contact areas 38a, 38b, 38c arranged on the first surface of the carrier layer 10, e.g. in the form of through-plating areas or so-called bonding pads for arranging an electrical component such as a chip module which is electrically connected to the conductor track 27. The contact areas 38a, 38b, 38c are connected to the conductor track 27 by plating.

The frame-shaped region 5 is subdivided into two frame sections 51, 53 running parallel to the x-axis 61 and two frame sections 52, 54 running parallel to the y-axis 62, said frame sections being bounded in each case by a bounding side 81, 82, 83, 84 of the outer rectangle 80 and a side 91, 92, 93, 94 of the inner rectangle 90 directly adjacent to the bounding side 81, 82, 83, 84 of the outer rectangle 80 and parallel thereto.

The conductor track 27 is embodied in a coil-shaped fashion, wherein the coil comprises a first turn 71, a second turn 72 and a contact auxiliary structure 73*d*. The contact auxiliary structure 73*d* ("auxiliary line") can serve to ensure that the contact area 38*c* connected to the contact auxiliary structure 73*d* can be reinforced by plating.

The frame sections 51, 52, 53, 54 subdivide the conductor track 27 into conductor track sections 71*a* to 71*d*, 72*a* to 72*d* and 73*d*. Thus, the conductor track sections 71*a* and 72*a* are assigned to a first frame section 51, the conductor track sections 71*b* and 72*b* are assigned to a second frame section 52, the conductor track sections 71*c* and 72*c* are assigned to a third frame section 53 and the conductor track sections 71*d*, 72*d* and 73*d* are assigned to a fourth frame section 54.

More than 50% of the length of the conductor track sections 71*b*, 72*b*, 71*d*, 72*d*, 73*d*, as viewed parallel to the z-axis 63, runs obliquely with respect to the x-axis 61 and the y-axis 62. The conductor track sections 71*b* and 72*b* run in a wavy fashion with an identical and constant period, with an identical and constant amplitude, with an identical phase and with a constant distance with respect to one another. In this case, the shape of the waves changes between a wave peak and a following wave valley. The conductor track sections 71*b* and 72*b* run in a wavy fashion with an identical period and a constant distance with respect to one another. The wave shape has approximately 6 periods. In this case, the shape of the waves changes between a wave peak and a following wave valley.

The conductor track sections 71*d* and 72*d* run substantially in the same way as the opposite conductor track sections 71*b* and 72*b*, except with mirrored orientation relative to a mirror axis running parallel to the y-axis 62. The conductor track sections 73*d* likewise runs in a wavy fashion with a constant amplitude, with the same period and the same phase as the conductor track sections 71*b*, 72*b*, 71*d* and 72*d*, but with a different wave shape.

Figure 6:
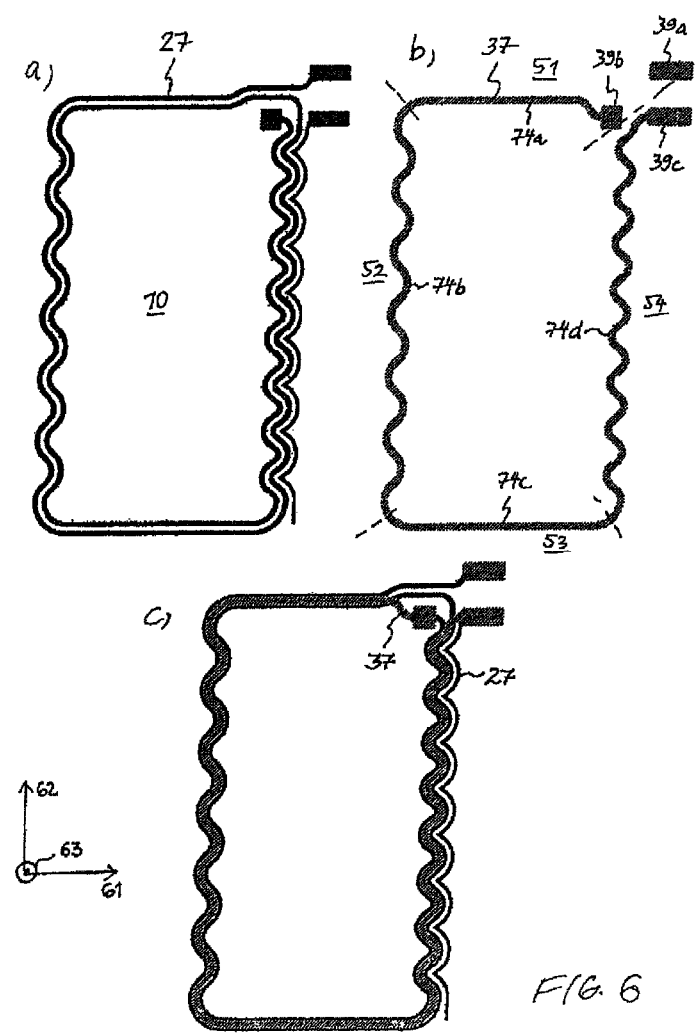
FIG. 6 shows plan views of the conductor track according to FIG. 5, of a second conductor track and of a superimposition of the first and second conductor tracks in accordance with a first exemplary embodiment of the invention.

FIG. 6 shows in part a) a plan view of the first conductor track 27 according to FIG. 5, as viewed counter to the direction of the z-axis 63. FIG. 6 shows in part b) a plan view of a second conductor track 37, which is arranged on a second surface, e.g. a rear side, of the carrier foil 10, in the same viewing direction as in part a). The second conductor track 37 is subdivided into the conductor track sections 74*a* to 74*d* by the frame sections 51 to 54. The second conductor track 37 has in each case approximately six periods of the wave shape in the conductor track sections 74*b* to 74*d*. Alongside the second conductor track 37, contact areas 39*a*, 39*b* and 39*c* are also arranged on the second surface of the carrier foil 10, of which only the contact areas 39*b* and 39*c* are electrically connected to the second conductor track 37.

FIG. 6 shows in part c) a plan view of a superimposition of the first conductor track 27 and the second conductor track 37, in the manner in which they are arranged on the carrier foil 10, in the same viewing direction as in part a) and in part b). On account of the similar course of the conductor tracks 27, 37 in the frame sections 51 to 54, the conductor tracks 27, 37 overlap with register accuracy, but only partly, the area of the conductor track 37 in each case partly overlapping the areas of two adjacent conductor tracks 27 and the interspace thereof (partial width overlap=PWO).

FIG. 7 to FIG. 12 show further exemplary embodiments of the conductor tracks 27, 37 in the manner of illustration according to FIG. 6. The differences of these exemplary embodiments are summarized in table 1, which also contains comparison values for a conventional foil element according to FIG. 1. In this case, the measured values indicated therein relate to the superimposition of the first conductor track 27 and the second conductor track 37 in accordance with part c) of FIGS. 1 and 7 to 12 relate. Measured values relative to an antenna relate to the antenna formed by the coupling of the first and second conductor tracks.

TABLE 1

Figure 7:
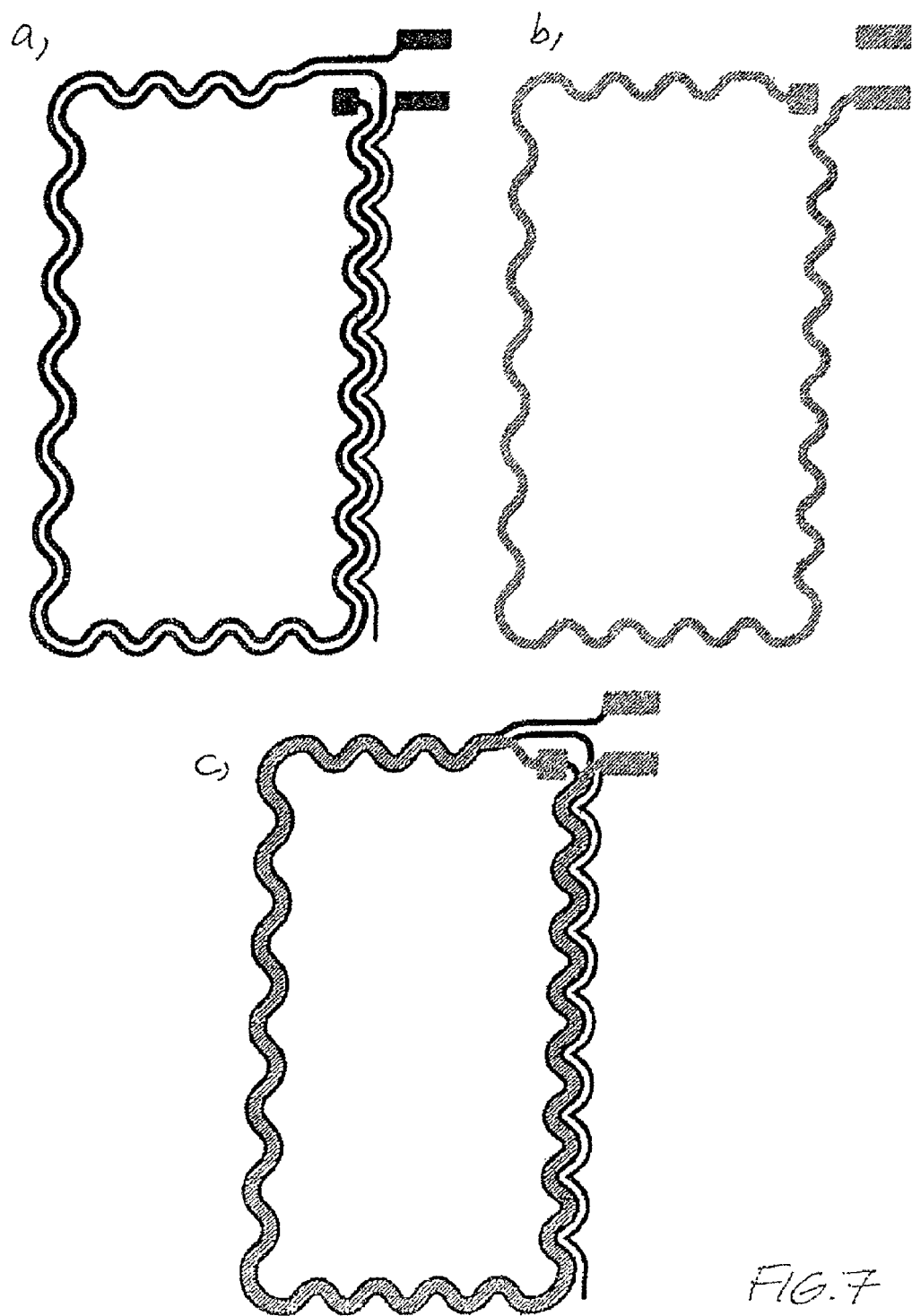
FIGS. 7 to 12 show plan views of a conductor track, of a second conductor track and of a superimposition of the first and second conductor tracks in accordance with further exemplary embodiments of the invention.
Figure 8:
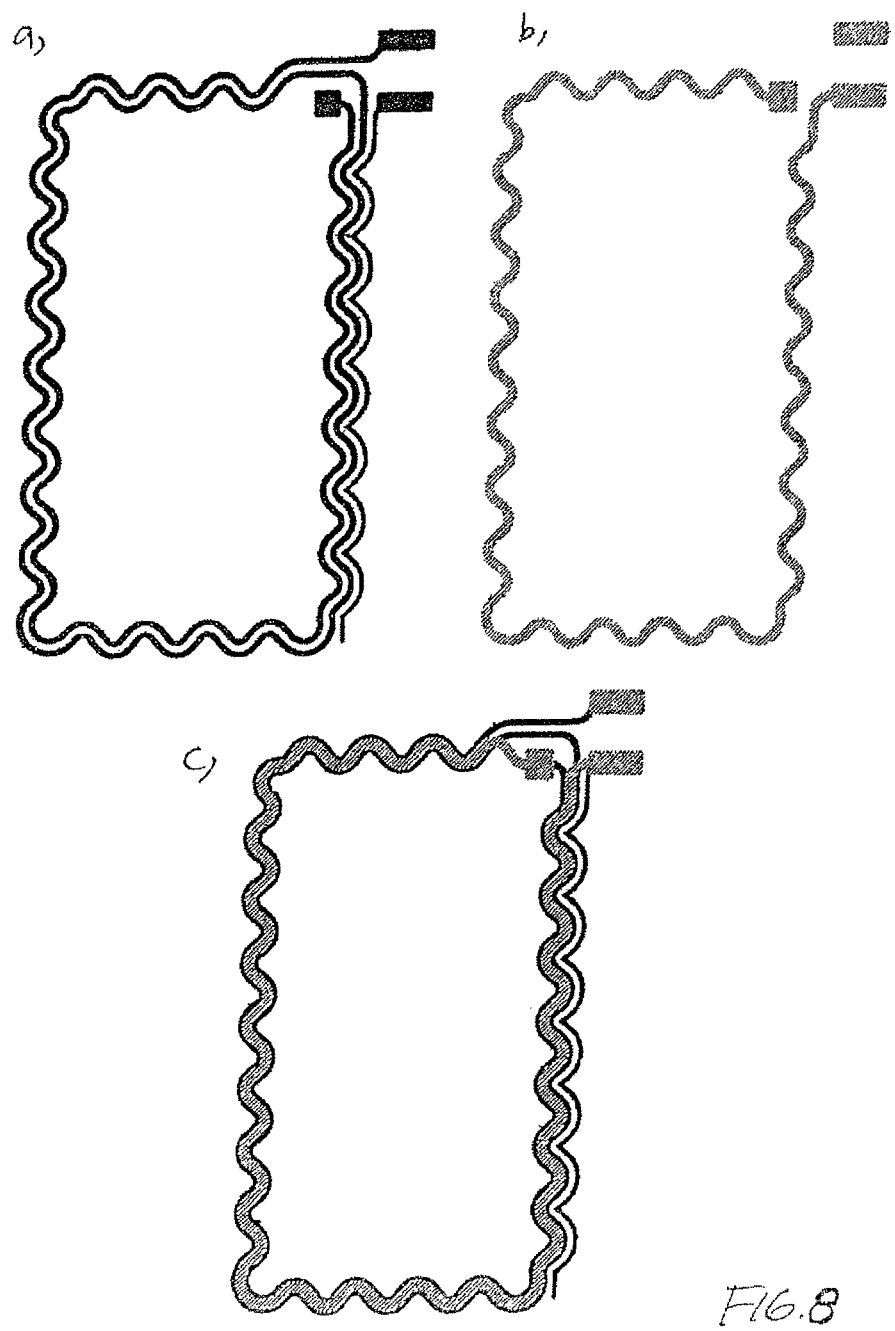
Figure 9:
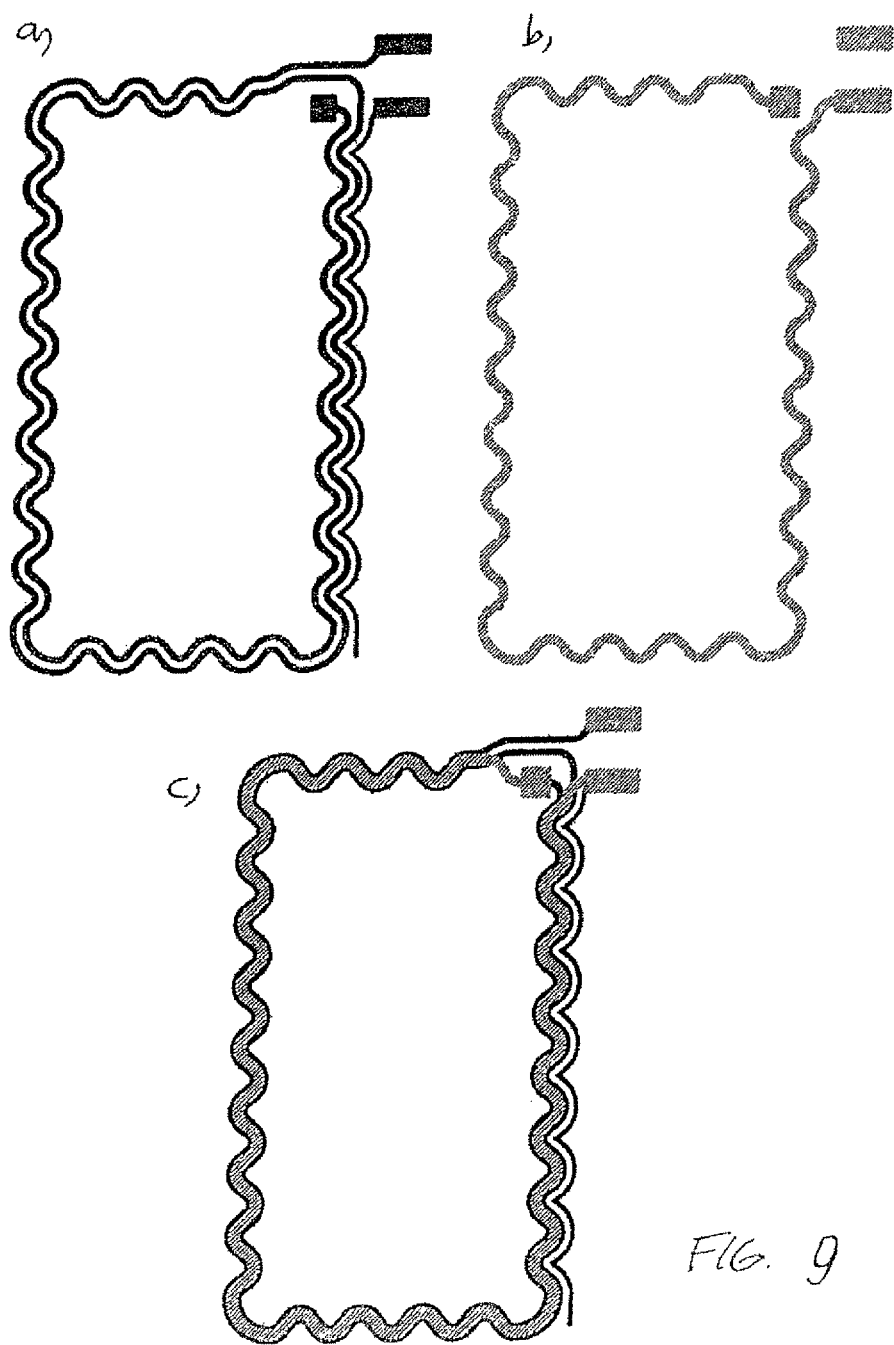
Figure 10:
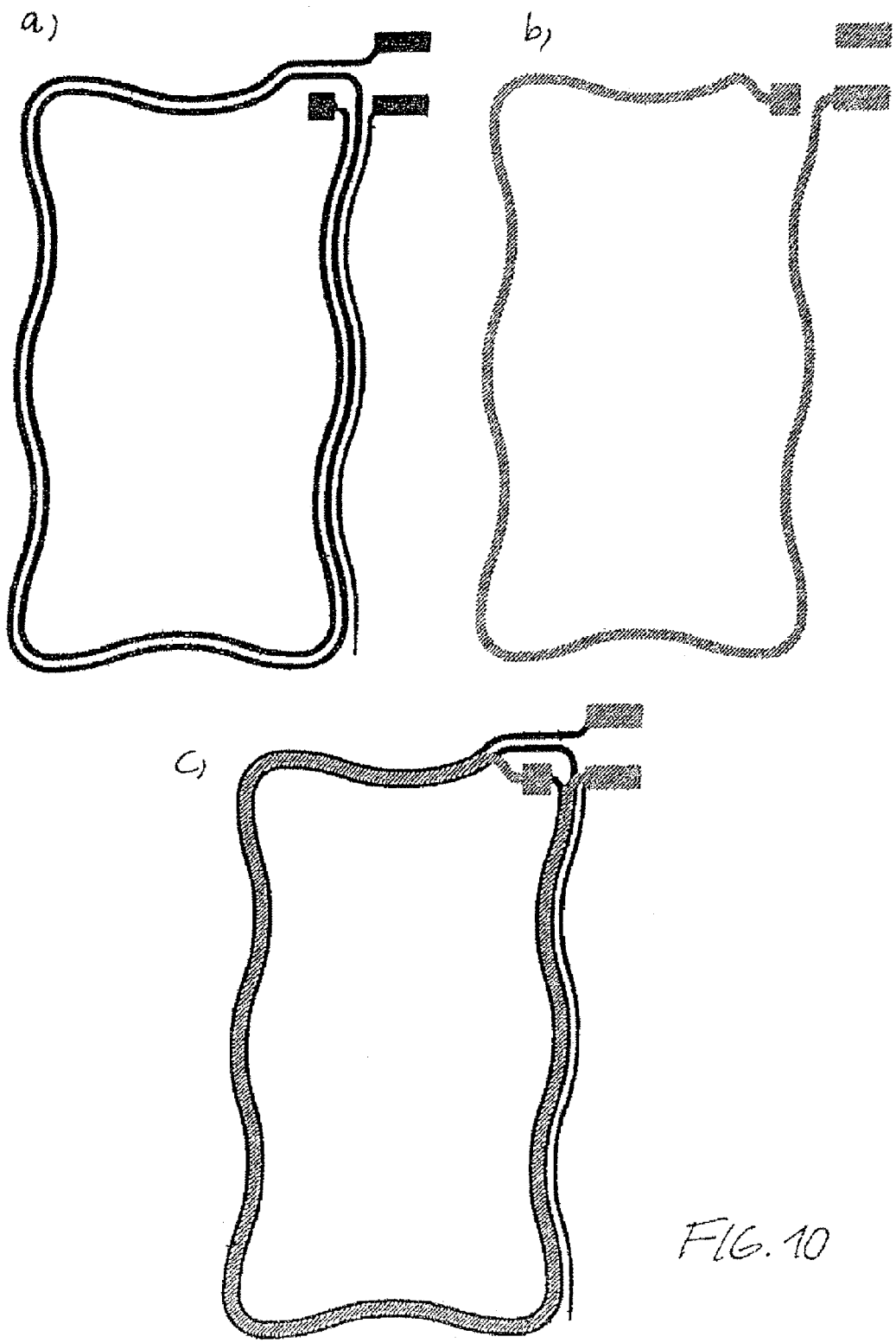
Figure 11:
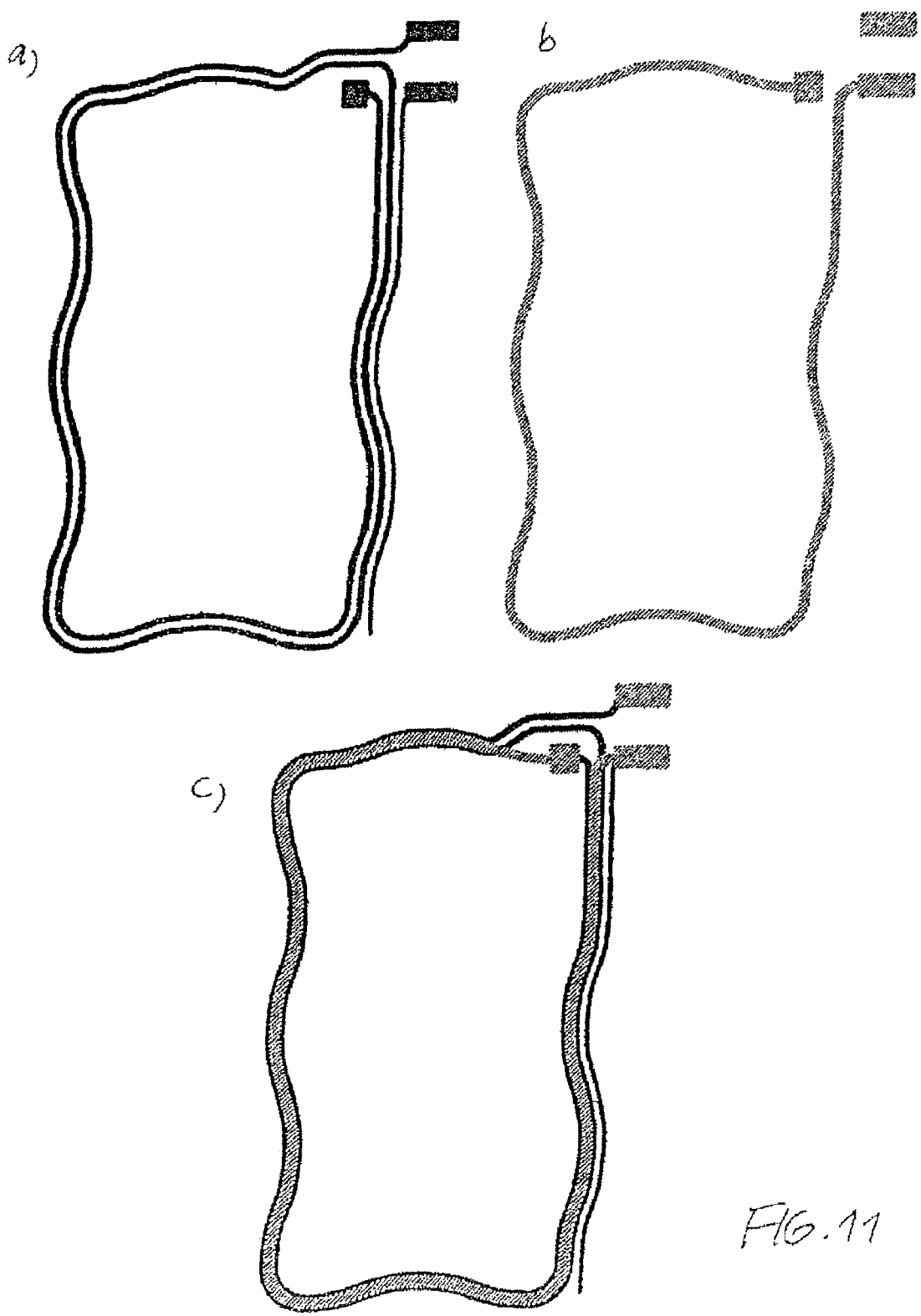
Figure 12:
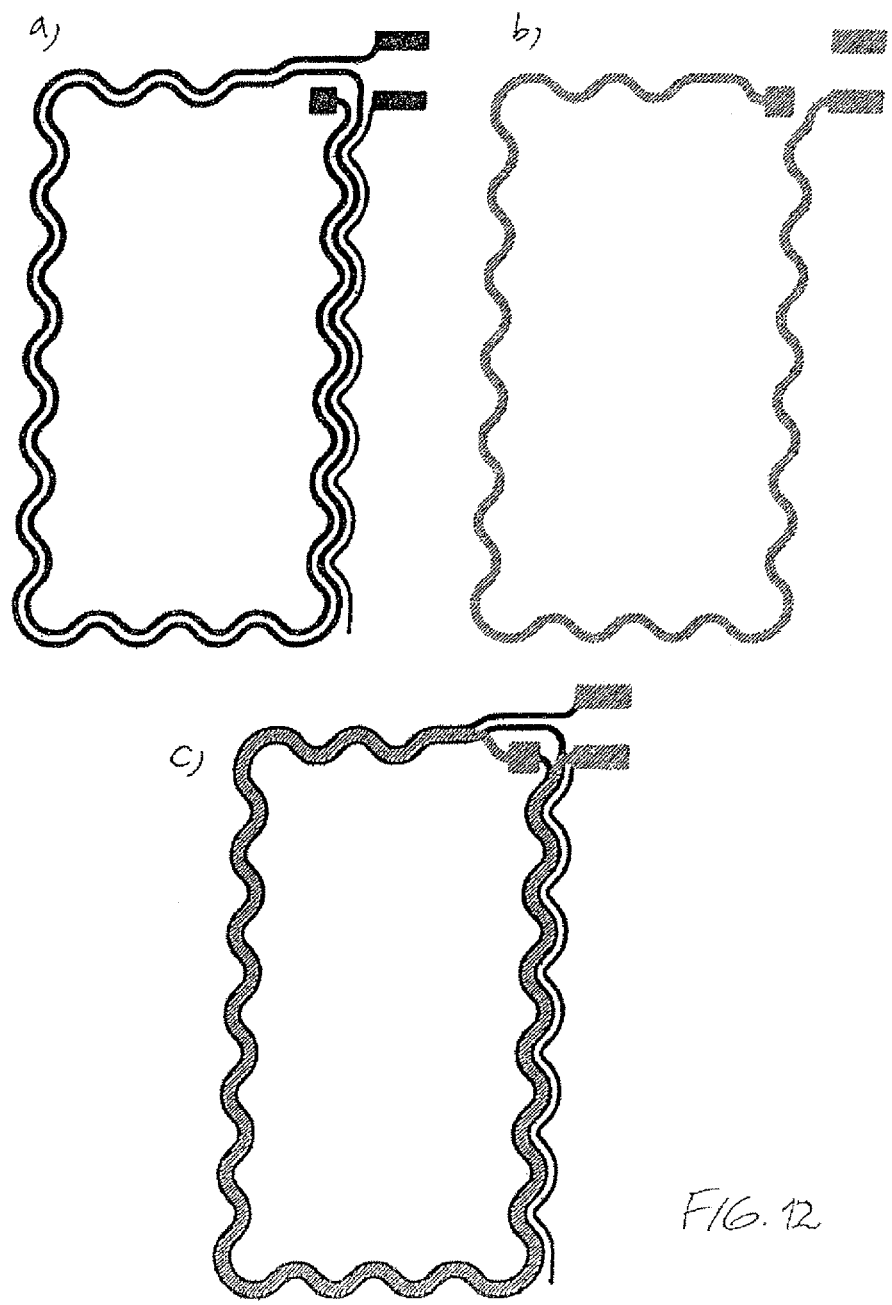

|    |                  | FIG. 1 | FIG. 7 | FIG. 8 | FIG. 9 | FIG. 10 | FIG. 11 | FIG. 12 |
|----|------------------|--------|--------|--------|--------|---------|---------|---------|
| 1  | Thickness        | 10     | 10     | 10     | 10     | 10      | 10      | 10      |
| 2  | Symmetry         | S      | AS     | AS     | S      | S       | AS      | S       |
| 3  | Frequency        | 17.4   | 16.58  | 16.99  | 16.81  | 17.86   | 18.28   | 17.19   |
| 4  | Resistance       | 1      | 1.47   | 1.53   | 1.73   | 1.13    | 1.07    | 1.40    |
| 5  | Q-Factor         | 56     | 34     | 28     | 28     | 51      | 57      | 36      |
| 6  | Inductance       | 2.426  | 2.411  | 2.356  | 2.396  | 2.367   | 2.337   | 2.385   |
| 7  | Amplitude        | 0      | 100    | 100    | 100    | 100     | 100     | 100     |
| 8  | Waves, top       | 0      | 3      | 3.5    | 3      | 0.75    | 0.75    | 2       |
| 9  | Waves, bottom    | 0      | 4      | 4      | 4      | 1       | 1       | 3       |
| 10 | Waves, left      | 0      | 6      | 8      | 8      | 2       | 2       | 6       |
| 11 | Waves, right     | 0      | 8      | 7.5    | 8      | 2       | 1.5     | 6       |
| 12 | Rank, waves      | 7      | 2      | 3      | 1      | 5       | 6       | 4       |
| 13 | Rank, frequency  | 5      | 1      | 3      | 2      | 6       | 7       | 4       |
| 14 | Rank, resistance | 7      | 3      | 2      | 1      | 5       | 6       | 4       |
| 15 | Rank, Q-factor   | 5      | 2      | 1      | 1      | 4       | 6       | 3       |

TABLE 1-continued

|  | FIG. 1 | FIG. 7 | FIG. 8 | FIG. 9 | FIG. 10 | FIG. 11 | FIG. 12 |
|---|---|---|---|---|---|---|---|
| 16 Length | 100 | 112.95 | 115.16 | 115.20 | 101.02 | 100.85 | 108.60 |
| 17 Rank, length | 7 | 3 | 2 | 1 | 5 | 6 | 4 |

An explanation of table 1 is given below.
The thickness indicated in row 1 indicates the thickness of the plated copper conductor tracks in the unit μm.
The symmetry indicated in row 2 indicates whether conductor track sections in opposite frame sections are symmetrical (=S) or asymmetrical (=AS) with respect to one another.
The frequency indicated in row 3 indicates the resonant frequency f of the antenna in the unit MHz.
The resistance indicated in row 4 indicates the electrical resistance of the antenna in the unit ohms.
The Q-factor indicated in row 5 indicates the quality factor of the antenna.
The inductance indicated in row 6 indicates the inductance of the antenna in the unit μH.
The amplitude indicated in row 7 indicates the amplitude of the waves in percent.
The variable "waves, top" indicated in row 8 indicates the number of waves (=number of periods) in the upper frame section.
The variable "waves, bottom" indicated in row 9 indicates the number of waves (=number of periods) in the lower frame section.
The variable "waves, left" indicated in row 10 indicates the number of waves (=number of periods) in the left frame section.
The variable "waves, right" indicated in row 11 indicates the number of waves (=number of periods) in the right frame section.
The variable "rank, waves" indicated in row 12 indicates a rank order with respect to the number of waves of the antennas described, wherein the antenna having the highest number of waves acquires the highest figure.
The variable "rank, frequency" indicated in row 13 indicates a rank order with respect to the resonant frequency f of the antenna in the unit MHz, wherein the antenna having the highest frequency acquires the highest figure.
The variable "rank, resistance" indicated in row 14 indicates a rank order with respect to the electrical resistance of the antennas described, wherein the antenna having the highest resistance acquires the highest figure.
The variable "rank, Q-factor" indicated in row 15 indicates a rank order with respect to the quality factor of the antennas described, wherein the antenna having the highest quality factor acquires the highest figure.
The length indicated in row 16 indicates the length of the antenna in percent.
The variable "rank, length" indicated in row 17 indicates a rank order with respect to the length of the antennas described, wherein the antenna having the smallest length acquires the highest figure.

LIST OF REFERENCE SIGNS

1 Foil element
5 Frame-shaped region
10 Carrier layer
20 First electrically conductive layer
21 Base layer
22 Reinforcement layer
27 Conductor track
28 Contact area
30 Second electrically conductive layer
31 Base layer
32 Reinforcement layer
37 Conductor track
38, 39 Contact area
41, 42 Decorative layer
43, 44 Protective lacquer layer
51-54 (First to fourth) frame section
61 x-axis
62 y-axis
63 z-axis
70 Coil
71a-d Conductor track sections
72a-d Conductor track sections
73d Conductor track section, auxiliary structure
74a-d Conductor track sections
80 Outer rectangle
81-84 (First to fourth) side
90 Inner rectangle
91-94 (First to fourth) side
E xy plane

The invention claimed is:

1. A foil element, comprising a dielectric carrier layer, which spans an xy plane of a Cartesian coordinate system having an x-axis, a y-axis and a z-axis, and at least one electrically conductive layer, which is arranged on the carrier layer and in which a conductor track is shaped in a frame-shaped region of the foil element, said region being formed by the area of a larger, outer rectangle having sides each running parallel to the x-axis or y-axis, from which area the area of a smaller, inner rectangle with the same orientation as the outer rectangle is cut out, wherein the frame-shaped region is subdivided into two frame sections running parallel to the x-axis and two frame sections running parallel to the y-axis, which frame sections are in each case bounded by a bounding side of the outer rectangle and a side of the inner rectangle directly adjacent to the bounding side of the outer rectangle and parallel thereto and subdivide the conductor track into conductor track sections, wherein a mechanical property of the carrier layer is different along the x-axis and the y-axis, and wherein more than 50% of the length of at least one conductor track section, as viewed parallel to the z-axis, runs obliquely with respect to the x-axis and the y-axis, and wherein the y-axis specifies the machine direction of the carrier layer and the x-axis specifies the transverse direction of the carrier layer running transversely with respect thereto, the machine direction being the running direction in which the carrier layer is moved during its production.

2. The foil element as claimed in claim 1, wherein at least 80% of the length of the at least one conductor track section runs obliquely with respect to the x-axis and the y-axis.

3. The foil element as claimed in claim 1, wherein the at least one conductor track section runs in a wavy or zigzag fashion in its obliquely running portion.

4. The foil element as claimed in claim 1, wherein the mechanical property is a deformation behavior, an inherent stress or a relaxation behavior.

5. The foil element as claimed in claim 1, wherein the length of a first side of the inner rectangle is at least 50%, of the length of a side of the outer rectangle parallel thereto and the length of a side of the inner rectangle running perpendicular to the first side of the inner rectangle is at least 70% of the length of a side of the outer rectangle parallel thereto.

6. The foil element as claimed in claim 1, wherein the at least one electrically conductive layer comprises a first electrically conductive layer, in which a first conductor track section of the conductor track is shaped in the frame-shaped region of the foil element, and a second electrically conductive layer, in which a second conductor track section of the conductor track is shaped in the frame-shaped region, wherein the carrier layer is arranged between the first and second electrically conductive layers, the first and second conductor track sections are coupled to one another to form an antenna structure and at least one conductor track portion of the first and second conductor track sections exhibits an oblique course.

7. The foil element as claimed in claim 1, wherein the course of the at least one conductor track section is described by {x;y} coordinate pairs defined by a structuring function F(x or respectively y).

8. The foil element as claimed in claim 7, wherein the structuring function F(x or respectively y) is designed such that the ratio of a sum of the partial lengths of the at least one conductor track section in which the conductor track section runs obliquely with respect to the x-axis and the y-axis to a total length of the at least one conductor track section is maximal.

9. The foil element as claimed in claim 7, wherein the structuring function F(x or respectively y) is a sine function of the form y=F(x)=A*sin (2*π*f*x+φ) or x=F(y)=A*sin (2*π*f*y+φ), wherein A is an amplitude, f is a frequency and φ is a phase angle.

10. The foil element as claimed in claim 7, wherein at least two conductor track sections have an oblique course, wherein at least one parameter defining the structuring function F(x or respectively y) in the at least two conductor track sections has different values in each case.

11. The foil element as claimed in claim 10, wherein parameters which define the substructuring function are: amplitude, frequency, phase, shape.

12. The foil element as claimed in claim 1, wherein all conductor track sections running parallel to the x-axis or all conductor track sections running parallel to the y-axis exhibit an oblique course.

13. The foil element as claimed in claim 1, wherein all conductor track sections exhibit an oblique course.

14. The foil element as claimed in claim 1, wherein two conductor track sections running in two parallel frame sections is designed to be symmetrical relative to an axial symmetry axis running parallel to the two parallel frame sections or relative to a point symmetry point.

15. The foil element as claimed in claim 1, wherein the length of at least one conductor track section extending between two points is approximately 0.5 to 30% greater than the length of the straight line distance between the two points.

16. A method for producing a foil element comprising the following steps:
providing a dielectric carrier layer, which spans an xy plane of a Cartesian coordinate system having an x-axis, a y-axis and a z-axis, wherein a mechanical property of the carrier layer is different along the x-axis and the y-axis, wherein the y-axis specifies the machine direction of the carrier layer and the x-axis specifies the transverse direction of the carrier layer running transversely with respect thereto, the machine direction being the running direction in which the carrier layer is moved during its production;
applying at least one electrically conductive layer to a surface of the carrier layer; and
shaping a conductor track in the at least one electrically conductive layer in a frame-shaped region of the foil element, said region being formed by the area of a larger, outer rectangle having sides each running parallel to the x-axis or y-axis, from which area the area of a smaller, inner rectangle with the same orientation as the outer rectangle is cut out, wherein the frame-shaped region is subdivided into two frame sections running parallel to the x-axis and two frame sections running parallel to the y-axis, which frame sections are in each case bounded by a bounding side of the outer rectangle and a side of the inner rectangle directly adjacent to the bounding side of the outer rectangle and parallel thereto and subdivide the conductor track into conductor track sections, in such a way that more than 50% of the length of at least one conductor track section, as viewed parallel to the z-axis, runs obliquely with respect to the x-axis and the y-axis.

* * * * *